(12) United States Patent
Sugahara et al.

(10) Patent No.: US 10,002,952 B2
(45) Date of Patent: Jun. 19, 2018

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Yoshiyuki Sugahara, Yamagata-mura (JP); Keiji Okumura, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days. days.

(21) Appl. No.: 15/609,487

(22) Filed: May 31, 2017

(65) Prior Publication Data

US 2018/0033876 A1 Feb. 1, 2018

(30) Foreign Application Priority Data

Jul. 29, 2016 (JP) ................................. 2016-150849

(51) Int. Cl.
*H01L 29/78* (2006.01)
*H01L 29/16* (2006.01)
(Continued)

(52) U.S. Cl.
CPC ...... *H01L 29/7397* (2013.01); *H01L 21/0274* (2013.01); *H01L 21/02529* (2013.01);
(Continued)

(58) Field of Classification Search
CPC ........... H01L 29/7825; H01L 29/66613; H01L 29/66621; H01L 29/66628;
(Continued)

(56) References Cited

U.S. PATENT DOCUMENTS

| 7,005,351 B2* | 2/2006 | Henninger ............ H01L 29/407 257/E29.128 |
| 2004/0079989 A1* | 4/2004 | Kaneko ................. H01L 29/165 257/328 |

(Continued)

FOREIGN PATENT DOCUMENTS

JP 2012-099601 A 5/2012
JP 2015-72999 A 4/2015

*Primary Examiner* — Benjamin Sandvik
*Assistant Examiner* — Gustavo Ramallo
(74) *Attorney, Agent, or Firm* — Rabin & Berdo, P.C.

(57) ABSTRACT

A silicon carbide (SiC) semiconductor device, including a SiC substrate, a first SiC layer formed on the substrate, first and second impurity layers selectively formed in the first SiC layer, a second SiC layer formed on the first SiC layer, a third impurity layer selectively formed in the second SiC layer and on the second impurity layer, a third SiC layer formed on the second SiC layer, a fourth impurity layer selectively formed in the third SiC layer, a trench that penetrates the fourth impurity layer and the second and third SiC layers, a bottom thereof reaching the first impurity layer, and a gate electrode formed in the trench via a gate insulating film. The first SiC layer has first and second regions adjacent respectively to the first and second impurity layers on a side facing the substrate, an impurity concentration at the first region being lower than that at the second region.

8 Claims, 14 Drawing Sheets

(51) Int. Cl.
*H01L 29/739* (2006.01)
*H01L 29/423* (2006.01)
*H01L 29/66* (2006.01)
*H01L 29/10* (2006.01)
*H01L 21/02* (2006.01)
*H01L 21/027* (2006.01)

(52) U.S. Cl.
CPC ...... *H01L 29/1095* (2013.01); *H01L 29/1608* (2013.01); *H01L 29/4236* (2013.01); *H01L 29/66348* (2013.01); *H01L 29/66734* (2013.01); *H01L 29/7813* (2013.01)

(58) Field of Classification Search
CPC ......... H01L 29/42336; H01L 29/42352; H01L 29/4236; H01L 29/7813
See application file for complete search history.

(56) References Cited

U.S. PATENT DOCUMENTS

| | | | | |
|---|---|---|---|---|
| 2006/0097267 | A1* | 5/2006 | Kumar | H01L 29/66068 257/77 |
| 2011/0303925 | A1* | 12/2011 | Nishimura | H01L 21/26586 257/77 |
| 2012/0280255 | A1* | 11/2012 | Masuda | H01L 29/1095 257/77 |
| 2016/0247910 | A1 | 8/2016 | Suzuki et al. | |
| 2017/0133466 | A1* | 5/2017 | Shiomi | H01L 29/1095 |

\* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2016-150849, filed on Jul. 29, 2016, the entire contents of which are incorporated herein by reference.

BACKGROUND OF THE INVENTION

1. Field of the Invention

Embodiments of the invention relate to a silicon carbide semiconductor device and method of manufacturing a silicon carbide semiconductor device.

2. Description of the Related Art

Silicon carbide semiconductors using silicon carbide (SiC) as a material are expected as next generation semiconductor elements, replacing those using silicon (Si). Compared to conventional semiconductor elements that use silicon, silicon carbide semiconductors have advantages such as lowering the resistance of the device in the ON state to several hundredths of that of a conventional semiconductor element and use in environments of higher temperatures (200 degrees C. or higher). These differences are consequent to characteristics of the material itself. For example, silicon carbide has a bandgap that is about 3 times larger than that of silicon and a dielectric breakdown field strength that is nearly 10 times higher than that of silicon.

As such a semiconductor device, a semiconductor device has been proposed in which a $p^+$ electric field mitigating region is formed to be in contact with the entire bottom portion of a trench in a drift layer and to extend to a position to partially contact a sidewall of the trench (for example, refer to Japanese Laid-Open Patent Publication No. 2012-099601). Further, a semiconductor device has been proposed in which a p-type bottom layer is formed so as to cover the bottom of a trench; an n-type current spreading layer is formed between a p-type base region and an $n^-$-type drift layer; and a deep layer in contact with the base region and reaching the drift layer is formed between trenches (for example, refer to Japanese Laid-Open Patent Publication No. 2015-072999).

Further, silicon carbide devices that have become commercial products include Schottky barrier diodes (SBDs), planar-type vertical metal-oxide-semiconductor field-effect-transistors (MOSFETs) and trench-type MOSFETs.

A trench-type MOSFET is a device having a 3-dimensional structure in which a trench (groove) is formed in a silicon carbide substrate and a sidewall of the trench is used as a channel. Therefore, when elements having the same ON resistance are compared, a trench type may have a smaller element area than that of a planar type and thus, is considered to be a promising device structure.

FIGS. 19, 20, 21, 22, 23, 24, 25, 26, 27, 28, 29, 30, 31, 32 and 33 are cross-sectional views of a silicon carbide semiconductor device during manufacture by a conventional method of manufacturing.

The state depicted in FIG. 19 will be described. First, an $n^+$-type silicon carbide substrate 1a containing an n-type silicon carbide is prepared. On a main surface of the $n^+$-type silicon carbide substrate 1a, an $n^-$-type silicon carbide epitaxial layer 1b containing silicon carbide is formed by epitaxial growth. As a result, a silicon carbide substrate 1 constituted by the $n^+$-type silicon carbide substrate 1a and the $n^-$-type silicon carbide epitaxial layer 1b may be formed.

The state depicted in FIG. 20 will be described. On the entire main surface of the silicon carbide substrate 1, a first n-type impurity layer 2 is formed. Next, as depicted in FIG. 21, on a surface of the silicon carbide substrate 1, a first $p^+$-type base 3 is selectively formed. Next, as depicted in FIG. 22, on the entire main surface of the silicon carbide substrate 1, an n-type silicon carbide layer 4 is formed. Next, as depicted in FIG. 23, on the entire surface of the n-type silicon carbide layer 4, a third n-type impurity layer 24 is formed. At the point depicted in FIG. 24, the third n-type impurity layer 24 is a layer in the entire n-type silicon carbide layer 4. Next, as depicted in FIG. 24, a second $p^+$-type base 5 is formed in a region directly above some of the first $p^+$-type bases 3 in the third n-type impurity layer 24.

Next, as depicted in FIG. 25, on the entire surface of the third n-type impurity layer 24, a p-type silicon carbide layer 7 that becomes a MOSFET channel portion is formed. Next, as depicted in FIG. 26, in a surface of the p-type silicon carbide layer 7, an $n^+$-type impurity layer 8 that becomes a MOSFET n-type source is formed. Next, as depicted in FIG. 27, a $p^{++}$-type impurity layer 9 is selectively formed in a region different from the $n^+$-type impurity layer 8 in the surface of the p-type silicon carbide layer 7.

Next, as depicted in FIG. 28, a deposited film to become a mask for trench etching is formed on the entire surface of the p-type silicon carbide layer 7 and of the formed deposited film, and the deposited film directly above a region forming a trench 11 is removed to form a deposited film 10. Next, as depicted in FIG. 29, in the p-type silicon carbide layer 7 on which the deposited film 10 is formed, a groove is dug, forming the trench 11. After the trench 11 is formed, the deposited film 10 is removed.

Next, as depicted in FIG. 30, at a sidewall and bottom of the trench 11, an oxide film is deposited, forming a gate insulating film 12. On the entire surface of a second $p^+$-type base region 17, a poly-silicon (poly-Si) is deposited, forming a gate electrode 13. Next, as depicted in FIG. 31, the gate electrode 13 is processed into a desired shape.

Next, as depicted in FIG. 32, an insulating film is deposited on the entire surface of the p-type silicon carbide layer 7 and the deposited insulating film is processed into a desired shape whereby an interlayer insulating film 14 for electrically insulating the gate electrode 13 and metal wiring 15 is formed. Next, as depicted in FIG. 33, on the entire surface of the p-type silicon carbide layer 7 forming the interlayer insulating film 14, a source electrode 42 is formed and the metal wiring 15 is formed so as to be embedded in a contact hole. After the state depicted in FIG. 33, on an opposite main surface (rear surface) of the silicon carbide substrate 1, on the opposite side from the n-type silicon carbide layer 4 side of the silicon carbide substrate 1, a rear electrode (not depicted) is formed. As a result, a trench-type MOSFET is completed in which a first $p^+$-type base region 16 constituted by the first $p^+$-type base 3 is formed at a bottom portion of the trench 11, and the second $p^+$-type base region 17 constituted by the first $p^+$-type base 3 and the second $p^+$-type base 5 is formed between the trenches 11.

SUMMARY OF THE INVENTION

According to one aspect of the present invention, a silicon carbide semiconductor device includes a silicon carbide substrate of a first conductivity type; a first silicon carbide layer of the first conductivity type, formed on a main surface of the silicon carbide substrate; a first impurity layer and a second impurity layer of a second conductivity type, selectively formed in a surface of the first silicon carbide layer; a second silicon carbide layer of the first conductivity type, formed on the surface of the first silicon carbide layer; a third impurity layer of the second conductivity type, selectively formed on the second impurity layer in the second silicon carbide layer; a third silicon carbide layer of the second conductivity type, formed on a surface of a first side of the second silicon carbide layer opposite a second side, the second side facing the first silicon carbide layer; a fourth impurity layer of the first conductivity type, selectively formed in a surface of the third silicon carbide layer; a trench that penetrates the fourth impurity layer, the third silicon carbide layer, and the second silicon carbide layer, the trench having a bottom portion that reaches the first impurity layer; a gate insulating film formed along a bottom and sidewalls of the trench; a gate electrode formed in the trench, on the gate insulating film; an interlayer insulating film covering the gate electrode; a first electrode in contact with the fourth impurity layer and the third silicon carbide layer; and a second electrode formed on a rear surface of the silicon carbide substrate. A first impurity concentration of the first conductivity type at a first region of the first silicon carbide layer is lower than a second impurity concentration of the first conductivity type at a second region of the first silicon carbide layer, the first region being adjacent to a rear side of the first impurity layer, the rear side facing the silicon carbide substrate, and the second region being adjacent to the rear side of the second impurity layer.

The silicon carbide semiconductor device includes a fifth impurity layer of the first conductivity type, selectively formed in the second region of the first silicon carbide layer so that the first impurity concentration of the first conductivity type at the first region is lower than the second impurity concentration of the first conductivity type at the second region.

In the silicon carbide semiconductor device, the second impurity layer has a width equal to a width of the fifth impurity layer.

In the silicon carbide semiconductor device, the first impurity layer is formed along a direction orthogonal to the main surface of the silicon carbide substrate to a first position, the first position being closer to the rear surface of the silicon carbide substrate than a second position to which the second impurity layer is formed.

According to another aspect of the present invention, a method of manufacturing a silicon carbide semiconductor device includes forming a first silicon carbide layer of a first conductivity type, on a main surface of a silicon carbide substrate of the first conductivity type; selectively forming a first impurity layer and a second impurity layer of a second conductivity type, in a surface of the first silicon carbide layer; forming a second silicon carbide layer of the first conductivity type, on the surface of the first silicon carbide layer; selectively forming a third impurity layer of the second conductivity type, on the second impurity layer in the second silicon carbide layer; forming a third silicon carbide layer of the second conductivity type, on a surface of a first side of the second silicon carbide layer opposite a second side, the second side facing the first silicon carbide layer; selectively forming a fourth impurity layer of the first conductivity type, in a surface of the third silicon carbide layer; forming a trench that penetrates the fourth impurity layer, the third silicon carbide layer, and the second silicon carbide layer and has a bottom portion that reaches the first impurity layer; forming a gate insulating film along a bottom and sidewalls of the trench; forming a gate electrode in the trench, on the gate insulating film; forming an interlayer insulating film covering the gate electrode; forming a first electrode in contact with the fourth impurity layer and the third silicon carbide layer; and forming a second electrode on a rear surface of the silicon carbide substrate. A first impurity concentration of the first conductivity type at a first region of the first silicon carbide layer is lower than a second impurity concentration of the first conductivity type at a second region of the first silicon carbide layer, the first region being adjacent to a rear side of the first impurity layer, the rear side facing the silicon carbide substrate, and the second region being adjacent to the rear side of the second impurity layer.

The method includes forming a fifth impurity layer of the first conductivity type, in the second region of the first silicon carbide layer so that the first impurity concentration of the first conductivity type at the first region is lower than the second impurity concentration of the first conductivity type at the second region.

In the method, forming the second impurity layer includes introducing an impurity of the second conductivity type into a region of the first silicon carbide layer adjacent to a first side of the fifth impurity layer so as to form the second impurity layer by self-alignment with respect to the fifth impurity layer, the first side facing the silicon carbide substrate.

In the method, selectively forming the first impurity layer and the second impurity layer in the surface of the first silicon carbide layer includes: forming a mask in a third region of the surface of the first silicon carbide layer exclusive of a fourth region where the first impurity layer and the second impurity layer are to be formed, forming a photoresist in the fourth region of the first silicon carbide layer where the first impurity layer is to be formed, introducing an impurity of the first conductivity type to the surface of the first silicon carbide layer so as to form the fifth impurity layer, removing the photoresist, introducing an impurity of the second conductivity type to the surface of the first silicon carbide layer so as to form the first impurity layer and the second impurity layer, and removing the mask.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
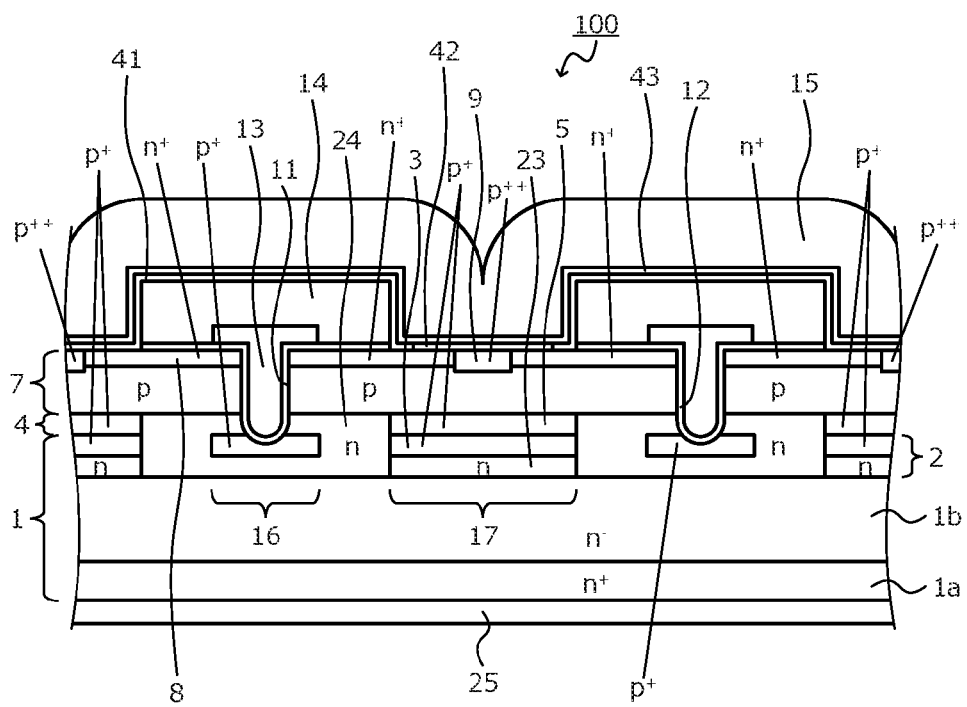
FIG. 1 is a cross-sectional view of an example of a structure of a silicon carbide semiconductor device according to an embodiment.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. Depending on the structure that is optimal, the concentrations may be reversed. In the description of the embodiments below and the accompanying drawings, main portions that are identical will be given the same reference numerals and will not be repeatedly described.

FIG. 1 is a cross-sectional view of an example of a structure of the silicon carbide semiconductor device according to an embodiment. A silicon carbide semiconductor device 100 according to the embodiment is a semiconductor device manufactured using silicon carbide (SiC), which is a wide bandgap semiconductor. In the example depicted in FIG. 1, the silicon carbide semiconductor device 100 is a trench-type vertical double diffused MOSFET (VDMOSFET) having a gate electrode in a trench.

Further in the example depicted in FIG. 1, the silicon carbide semiconductor device 100 is a single transistor formed by connecting, in parallel, plural unit cells (functional units of an element) each constituted by a trench metal-oxide-semiconductor (MOS) structure. However, in FIG. 1, only some of the unit cells (2 cells) of the silicon carbide semiconductor device 100 are depicted.

In the silicon carbide semiconductor device 100, a first n-type impurity layer (first silicon carbide layer) 2 is formed on a main surface (front surface) of the silicon carbide substrate 1 containing silicon carbide of an n-type (first conductivity type). The first n-type impurity layer 2 and the n-type silicon carbide layer 4 are called a current spreading layer (CSL) and are formed to reduce resistance and facilitate electron current flow by increasing a substrate concentration directly beneath the first p$^+$-type base 3 described hereinafter. Directly beneath the first p$^+$-type base 3 means a region of the first n-type impurity layer 2 adjacent to the rear surface side (silicon carbide substrate 1 side) of the first p$^+$-type base 3.

In the CSL constituted by the first n-type impurity layer 2 and the n-type silicon carbide layer 4, the first p$^+$-type base region 16 and the second p$^+$-type base region 17 are formed. The first p$^+$-type base region 16 is formed by the first p$^+$-type base 3 reached by the bottom portion of the trench 11. The second p$^+$-type base region 17 is formed by the first p$^+$-type base 3 at a position beneath the p$^{++}$-type impurity layer 9 and by the second p$^+$-type base 5. In other words, the first p$^+$-type base region 16 and the second p$^+$-type base region 17 are arranged separately from each other, alternating along an array direction of the trenches 11. Further, the first p$^+$-type base region 16 is provided at the bottom portion of each of the trenches 11 and the second p$^+$-type base region 17 is provided between the trenches 11.

At the main surface of the silicon carbide substrate 1, the first p$^+$-type base 3 is formed. Among the first p$^+$-type bases 3, the first p$^+$-type base region (first impurity layer) 16 and a portion of the second p$^+$-type base region (second impurity layer) 17 are included. Further, on the main surface of the silicon carbide substrate 1, the n-type silicon carbide layer (second silicon carbide layer) 4 is formed. In a region of the n-type silicon carbide layer 4 directly above some of the first p$^+$-type bases 3, the second p$^+$-type base (third impurity layer) 5 that is a portion of the second p$^+$-type base region 17 is formed. Directly above the first p$^+$-type base 3 in the n-type silicon carbide layer 4 means a region of the n-type silicon carbide layer 4 adjacent to the p-type silicon carbide layer 7 side of the first p$^+$-type base 3. On the surface of the n-type silicon carbide layer 4, the p-type silicon carbide layer (third silicon carbide layer) 7 is formed. In the surface of the p-type silicon carbide layer 7, the n$^+$-type impurity layer (fourth impurity layer) 8 and the p$^{++}$-type impurity layer 9 are formed.

In the first n-type impurity layer 2, a second n-type impurity layer (fifth impurity layer) 23 is formed directly beneath the second p$^+$-type base region 17. In the first n-type impurity layer 2, directly beneath the second p$^+$-type base region 17 means a region of the first n-type impurity layer 2 adjacent to the rear surface side (the silicon carbide substrate 1 side) of the second p$^+$-type base region 17. On the other hand, in the first n-type impurity layer 2 directly beneath the first p$^+$-type base region 16, the second n-type impurity layer 23 is not formed. In the first n-type impurity layer 2 directly beneath the first p$^+$-type base region 16 means a region of the first n-type impurity layer 2 adjacent to the rear surface side (the silicon carbide substrate 1 side) of the first p$^+$-type base region 16.

The second n-type impurity layer 23 functions as a current spreading layer and is introduced into regions of the first n-type impurity layer 2. Therefore, for example, the second n-type impurity layer 23 is called a partial current spreading layer. The second n-type impurity layer 23 enables the n-type impurity concentration (impurity concentration of the first conductivity type) directly beneath the first p$^+$-type base region 16 to be set lower than the n-type impurity concentration directly beneath the second p$^+$-type base region 17, enabling the breakdown voltage directly beneath the first p$^+$-type base region 16 to be set higher than the breakdown voltage directly beneath the second p$^+$-type base region 17. The breakdown voltage is the voltage limit that does not cause element breakdown.

Further, the presence of the second n-type impurity layer 23 enables the first p$^+$-type base region 16 to be formed deeper than the second p$^+$-type base region 17. Forming the first p$^+$-type base region 16 to be deeper than the second p$^+$-type base region 17 means forming the first p$^+$-type base region 16 to a position closer to the rear surface of the silicon carbide substrate 1 in a direction orthogonal to the main surface of the silicon carbide semiconductor device 100, as compared to the position of the second p$^+$-type base region 17. Forming the first p$^+$-type base region 16 to be deeper than the second p$^+$-type base region 17 causes the electric field applied to the second p$^+$-type base region 17 to be stronger than that applied to the first p$^+$-type base region 16 and when avalanche current flows, current flows in the second p$^+$-type base region 17, enabling the oxide film of the trench bottom portion in contact with the first p$^+$-type base region 16 to be protected.

The trench 11 penetrates the n-type silicon carbide layer 4 from the p-type silicon carbide layer 7 and is formed so that the bottom portion reaches the first p$^+$-type base region 16 of the first p$^+$-type base 3 in the first n-type impurity layer 2. Further, for example, the trench 11 is a trench having a striped shape extending outward from the surface of the drawing. However, the shape of the trench 11 is not limited to a striped shape and may be a polygon such as a hexagon. Inside the trench 11, the gate insulating film 12 is formed along the bottom and side walls. On the gate insulating film 12, the gate electrode 13 is formed.

On the surface of the p-type silicon carbide layer 7, the interlayer insulating film 14 for electrically insulating the gate electrode 13 and the metal wiring 15 is formed. On the surface of the p-type silicon carbide layer 7 on which the interlayer insulating film 14 is formed, the metal wiring (first electrode) 15 is formed. The metal wiring 15 is connected to the source electrode of the silicon carbide semiconductor device 100.

On an opposite main surface (rear surface) of the silicon carbide substrate 1 opposite from the n-type silicon carbide layer 4 side, a rear electrode (second electrode) 25 is formed. The rear electrode 25 is a drain electrode.

According to the silicon carbide semiconductor device 100, the second n-type impurity layer 23 is selectively formed, enabling the n-type impurity concentration directly beneath the first $p^+$-type base region 16 to be set to be lower than the n-type impurity concentration directly beneath the second $p^+$-type base region 17. As a result, the second $p^+$-type base region 17 may configured to be a region that rate limits the breakdown voltage of the element rather than the first $p^+$-type base region 16 of the bottom portion of the trench 11. In other words, the breakdown voltage of the first $p^+$-type base region 16 may be set to be higher than the breakdown voltage of the second $p^+$-type base region 17.

Therefore, avalanche breakdown may be caused selectively in the second $p^+$-type base region 17, enabling the occurrence of avalanche breakdown at the bottom portion of the trench 11 to be suppressed. Therefore, for example, modulation of the local electric field in the gate insulating film 12 consequent to carriers being injected to the gate insulating film 12 at the bottom portion of the trench 11 and the dielectric breakdown of the gate insulating film 12 may be suppressed.

FIGS. 2, 3, 4, 5, 6, 7, 8, 9, 10, 11, 12, 13, 14, 15, 16, 17, and 18 are cross-sectional views of the silicon carbide semiconductor device during manufacture by the method of manufacturing a silicon carbide semiconductor device according to the embodiment. In FIGS. 2 to 18, a method of manufacturing the silicon carbide semiconductor device 100 depicted in FIG. 1 will be described.

Figure 2:
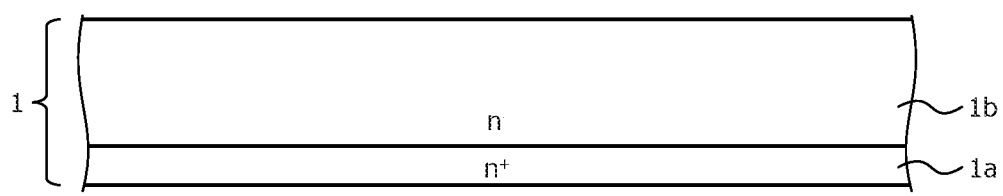
FIGS. 2, 3, 4, 5, 6, 7, 8, 9, 10, 11, 12, 13, 14, 15, 16, 17 and 18 are cross-sectional views of the silicon carbide semiconductor device during manufacture by a method of manufacturing a silicon carbide semiconductor device according to the embodiment.

The state depicted in FIG. 2 will be described. First, the $n^+$-type silicon carbide substrate $1a$ containing silicon carbide of an n-type is prepared. On the main surface of the $n^+$-type silicon carbide substrate $1a$, the $n^-$-type silicon carbide epitaxial layer $1b$ containing silicon carbide is formed by epitaxial growth. The process of this epitaxial growth is performed while an impurity of an $n^-$-type is doped. As a result, the silicon carbide substrate 1 constituted by the $n^+$-type silicon carbide substrate $1a$ and the $n^-$-type silicon carbide epitaxial layer $1b$ may be formed.

Figure 3:
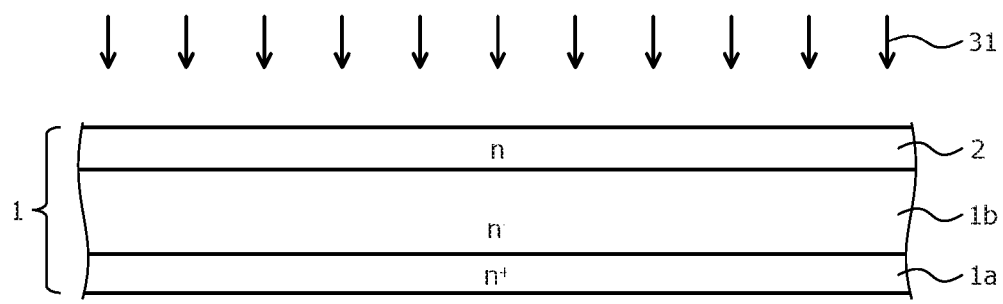

Next, the state depicted in FIG. 3 will be described. An n-type impurity 31 is introduced into the entire main surface of the silicon carbide substrate 1 whereby the first n-type impurity layer 2 is formed. Formation of the first n-type impurity layer 2 by the introduction of the n-type impurity 31, for example, may be performed by ion implantation. For example, nitrogen (N) atoms may be used as an impurity of an n-type, such as for the n-type impurity 31.

Figure 4:
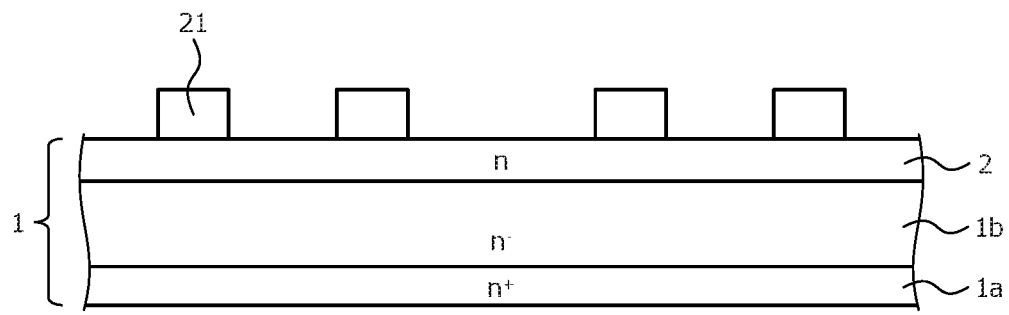

The state depicted in FIG. 4 will be described. After the state depicted in FIG. 3, an oxide film is deposited on the entire main surface of the silicon carbide substrate 1. Formation of the deposited oxide film, for example, may be performed by low-pressure chemical vapor deposition (LP-CVD). Of the deposited oxide film, the deposited oxide film directly above regions becoming the first $p^+$-type base region 16 and the second $p^+$-type base region 17 is selectively removed, forming an oxide film mask (mask) 21.

Figure 5:
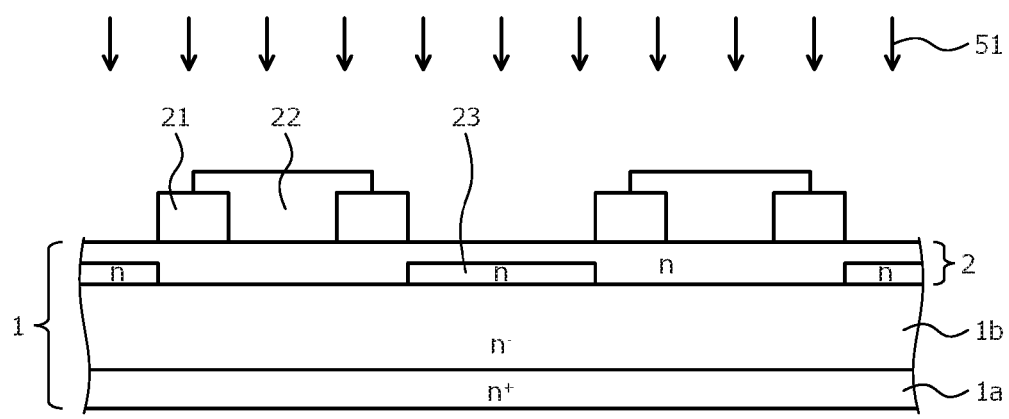

The state depicted in FIG. 5 will be described. After the state depicted in FIG. 4, on the main surface of the silicon carbide substrate 1 on which the oxide film mask 21 is formed, a photoresist 22 is formed so as to cover and hide a region to become the first $p^+$-type base region 16. Formation of the photoresist 22, for example, may be performed by a photo etching method. After the formation of the photoresist 22, an n-type impurity 51 is introduced from the entire surface of the first n-type impurity layer 2 whereby the second n-type impurity layer 23 is formed. The second n-type impurity layer 23 is a region (counter-doped layer) having an n-type impurity concentration that is higher than that of other portions of the first n-type impurity layer 2.

Formation of the second n-type impurity layer 23 by the introduction of the n-type impurity 51, for example, may be performed by ion implantation. Further, for example, by adjusting the ion implantation energy, the second n-type impurity layer 23 is formed in a region of the first n-type impurity layer 2 on the $n^-$-type silicon carbide epitaxial layer $1b$ side. As a result, the second n-type impurity layer 23 is formed only directly beneath the second $p^+$-type base region 17 and no n-type impurity layer is formed directly beneath the first $p^+$-type base region 16.

Figure 6:
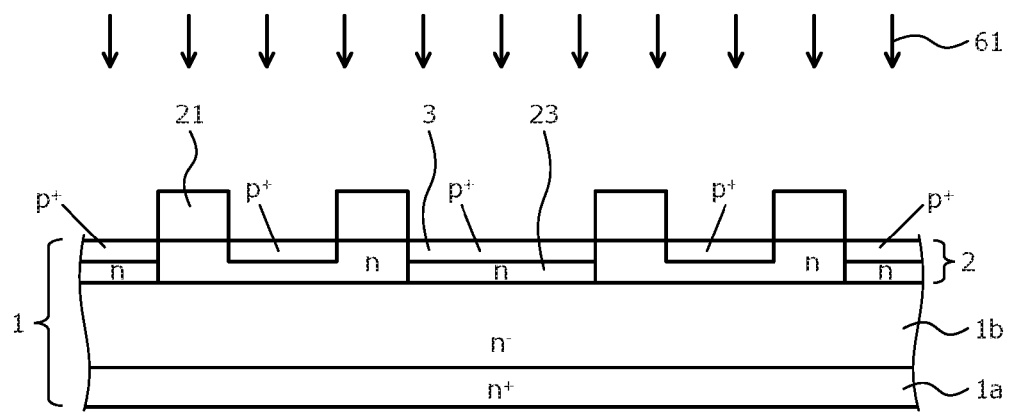

Next, as depicted in FIG. 6, the photoresist 22 is removed and in this state, a p-type impurity 61 is selectively introduced on the surface of the silicon carbide substrate 1 whereby the first $p^+$-type base 3 is selectively formed. Formation of the first $p^+$-type base 3 by the introduction of the p-type impurity 61, for example, may be performed by ion implantation. Aluminum (Al) may be used as an impurity of a p-type, such as for the p-type impurity 61.

The first $p^+$-type bases 3 formed here include a first $p^+$-type base 3 formed directly above a region where the second n-type impurity layer 23 is not formed, and a first $p^+$-type base 3 formed directly above a region where the second n-type impurity layer 23 is formed. The first $p^+$-type base 3 formed directly above a region where the second n-type impurity layer 23 is not formed becomes the first $p^+$-type base region 16. The first $p^+$-type base 3 formed directly above a region where the second n-type impurity layer 23 is formed becomes the second $p^+$-type base region 17 together with the second $p^+$-type base 5 formed directly above the first $p^+$-type base 3.

By following this process, the first $p^+$-type base region 16 and the second $p^+$-type base region 17 may be formed without deviation. Further, the first $p^+$-type base 3 formed in the region where the second n-type impurity layer 23 is formed may be formed by self-alignment without deviation with respect to the second n-type impurity layer 23. In other words, even without operations for aligning the first $p^+$-type base 3 with the second n-type impurity layer 23, the first $p^+$-type base 3 may be formed automatically without deviation with respect to the second n-type impurity layer 23. In this case, the first $p^+$-type base 3 becoming the second $p^+$-type base region 17 is formed to have the same width as that of the second n-type impurity layer 23. However, the second n-type impurity layer 23 and the first $p^+$-type base 3 may also be formed by a resist mask.

Although a case in which the first $p^+$-type base 3 is formed subsequent to the second n-type impurity layer 23 has been described, the second n-type impurity layer 23 may be formed subsequent to the first $p^+$-type base 3.

Further, the second n-type impurity layer 23 may be formed in the entire region in the depth direction, i.e., the second n-type impurity layer 23 may be formed to have the same thickness as that of the first n-type impurity layer 2. In this case, although the second n-type impurity layer 23 and the second $p^+$-type base region 17 of the first $p^+$-type base 3 overlap, at the time of formation of the first $p^+$-type base 3, the second n-type impurity layer 23 may be reversed to a p-type, forming the second p⁺-type base region 17 of the first p⁺-type base 3. Therefore, the impurity concentration of the first p⁺-type base region 16 becomes higher than the impurity concentration of the second p⁺-type base region 17 of the first p⁺-type base 3.

A case in which the first p⁺-type base region 16 and the second p⁺-type base region 17 are formed by differing impurities will be described. In this case, conventionally, for example, high p-type impurity (Al) ion implantation for the first p⁺-type base region 16, damage removal, low p-type impurity (Al) ion implantation for the second p⁺-type base region 17, damage removal, and epitaxial layer formation are sequentially performed. In contrast, the present invention, for example, enables n-type impurity (nitrogen) ion implantation for the second n-type impurity layer 23, p-type impurity (Al) ion implantation for the first p⁺-type base region 16 and the second p⁺-type base region 17, damage removal, and epitaxial layer (nitrogen) formation to be sequentially performed. In the p-type impurity (Al) ion implantation for the second p⁺-type base region 17, the second n-type impurity layer 23 is reversed to a p-type, forming a portion of the second p⁺-type base region 17. As a result, the damage removal process before epitaxial layer formation is performed only once.

Figure 7:
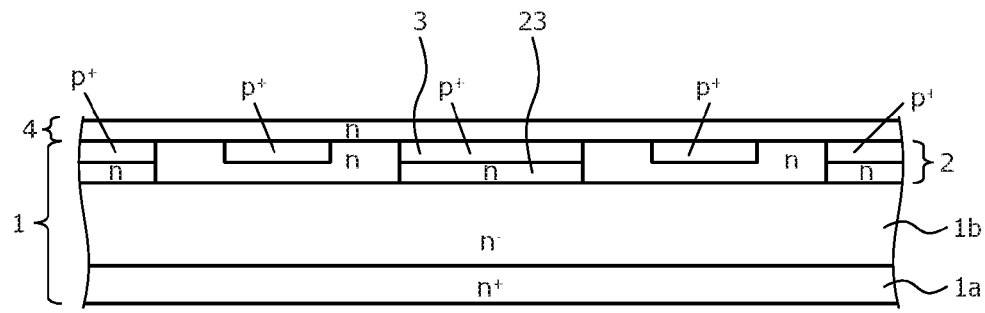

Next, as depicted in FIG. 7, after the oxide film mask 21 is removed, on the entire main surface of the silicon carbide substrate 1, the n-type silicon carbide layer 4 is formed. Formation of the n-type silicon carbide layer 4, for example, may be performed by an epitaxial method.

Figure 8:
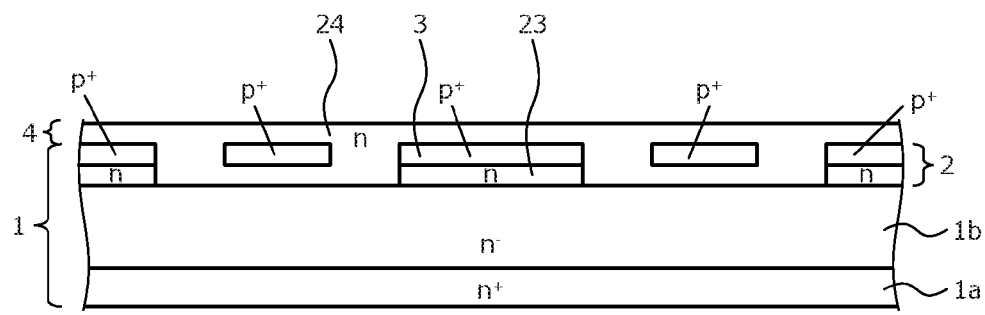

Next, as depicted in FIG. 8, an n-type impurity 81 is introduced from the entire surface of the n-type silicon carbide layer 4 whereby the third n-type impurity layer 24 is formed. At the point depicted in FIG. 8, the third n-type impurity layer 24 is a layer formed in the entire n-type silicon carbide layer 4. Formation of the third n-type impurity layer 24 by the introduction of the n-type impurity 81, for example, may be performed by ion implantation.

Figure 9:
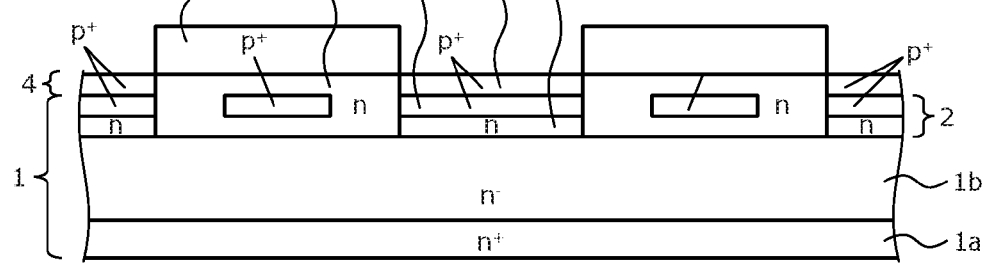

The state depicted in FIG. 9 will be described. After the state depicted in FIG. 8, a deposited oxide film is formed on the entire main surface of the n-type silicon carbide layer 4. Formation of the deposited oxide film, for example, may be performed by a LP-CVD method. Of the deposited oxide film, the deposited oxide film directly above a region becoming the second p⁺-type base 5 is selectively removed, forming an oxide film mask 71. Next, a p-type impurity 91 is introduced from the entire surface of the n-type silicon carbide layer 4 whereby the second p⁺-type base 5 is selectively formed. Formation of the second p⁺-type base 5 by the introduction of the p-type impurity 91, for example, may be performed by ion implantation. The second p⁺-type base region 17 is constituted by the first p⁺-type base 3 and the second p⁺-type base 5. The oxide film mask 71 is removed.

Figure 10:
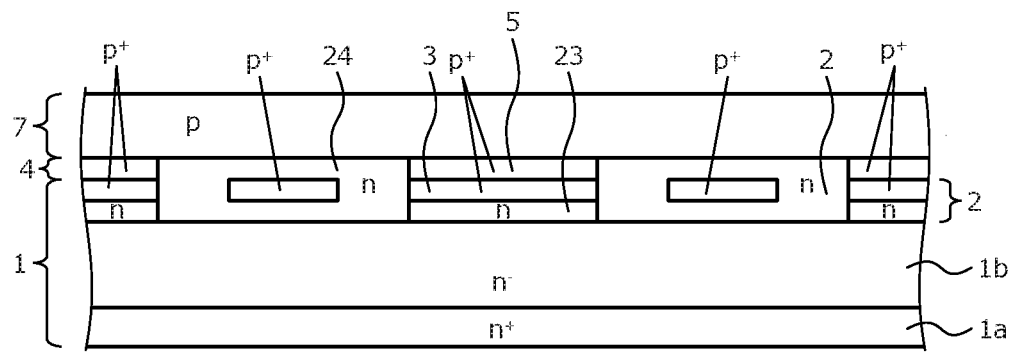

Next, as depicted in FIG. 10, on the entire surface of the third n-type impurity layer 24, the p-type silicon carbide layer 7 becoming the MOSFET channel portion is formed. Formation of the p-type silicon carbide layer 7, for example, may be performed by an epitaxial method.

Figure 11:
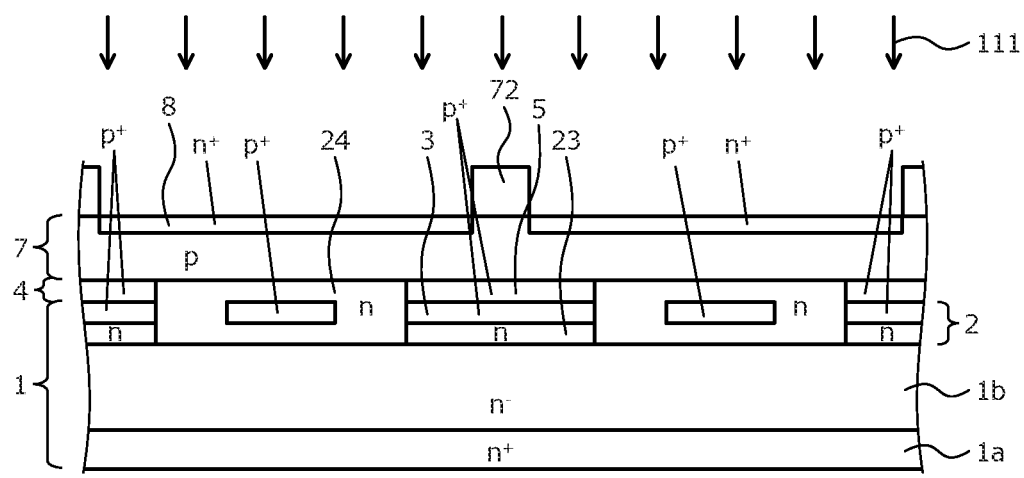

The state depicted in FIG. 11 will be described. After the state depicted in FIG. 10, on the entire main surface of the p-type silicon carbide layer 7, a deposited oxide film is formed. Formation of the deposited oxide film, for example, may be performed by a LP-CVD method. Of the deposited oxide film, the deposited oxide film directly above a region becoming the n⁺-type impurity layer 8 is selectively removed, forming an oxide film mask 72. Next, from the entire surface of the p-type silicon carbide layer 7, an n-type impurity 111 is introduced at a high concentration whereby the n⁺-type impurity layer 8 that becomes the MOSFET n-type source is selectively formed. Formation of the n⁺-type impurity layer 8 by the introduction of the n-type impurity 111, for example, may be performed by ion implantation. The oxide film mask 72 is removed.

Figure 12:
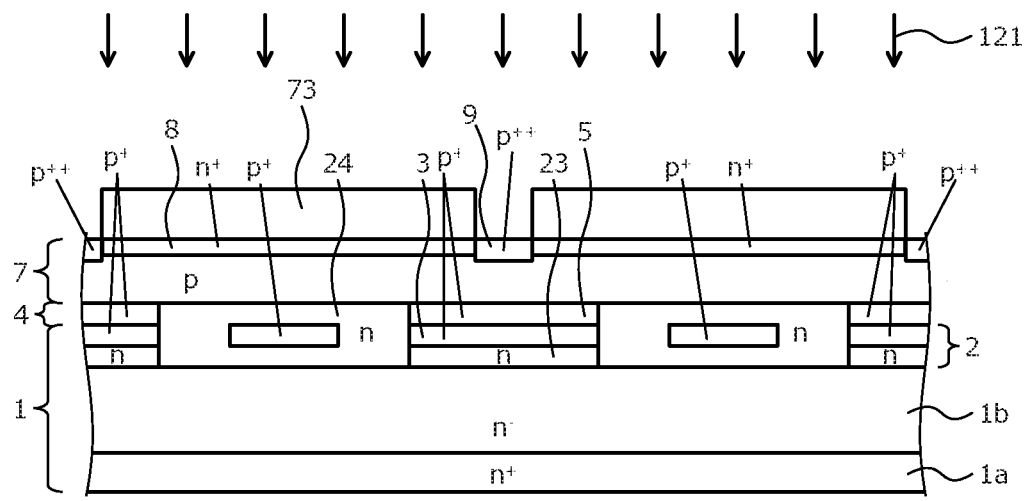

The state depicted in FIG. 12 will be described. After the state depicted in FIG. 11, on the entire main surface of the p-type silicon carbide layer 7, a deposited oxide film is formed. Formation of the deposited oxide film, for example, may be performed by a LP-CVD method. Of the deposited oxide film, the deposited oxide film directly above a region becoming the p⁺⁺-type impurity layer 9 is selectively removed, forming an oxide film mask 73. Next, from the entire surface of the p-type silicon carbide layer 7, a p-type impurity 121 is introduced at a high concentration whereby the p⁺⁺-type impurity layer 9 is selectively formed. Formation of the p⁺⁺-type impurity layer 9 by the introduction of the p-type impurity 121, for example, may be performed by ion implantation. The oxide film mask 73 is removed.

Figure 13:
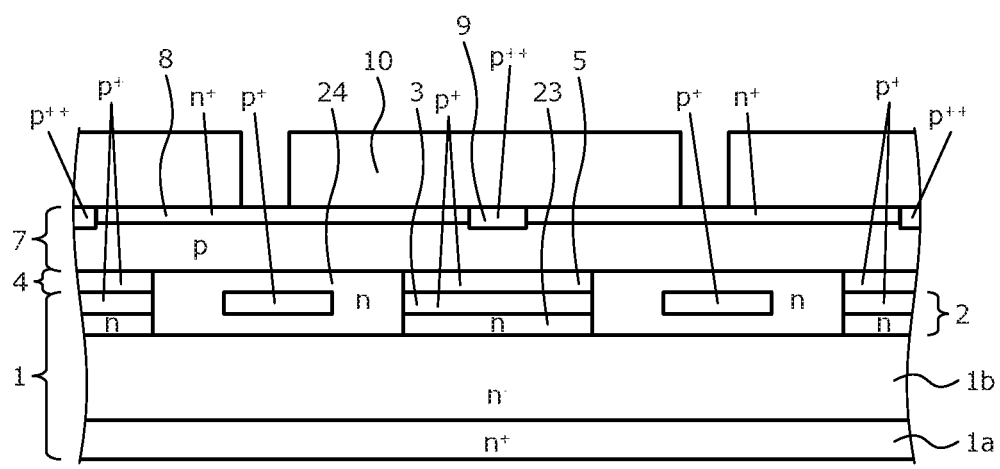

Next, as depicted in FIG. 13, on the entire surface of the p-type silicon carbide layer 7, a deposited film becoming a mask for trench etching is formed. Of the deposited film, the deposited film directly above a region forming the trench 11 is removed whereby the deposited film 10 is formed. Removal of the deposited film, for example, may be performed by a photo etching method. For example, an oxide film deposited by a CVD method may be used for the deposited film 10 so that the deposited film 10 is not scorched by the increase in temperature from trench etching when the trench 11 is formed.

Figure 14:
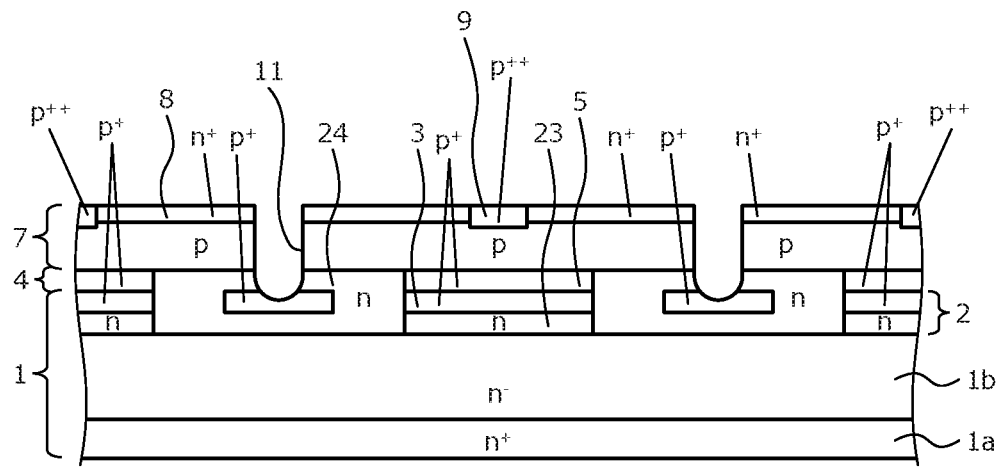

Next, as depicted in FIG. 14, a groove is dug into the p-type silicon carbide layer 7 on which the deposited film 10 is formed whereby the trench 11 is formed. Formation of the trench 11, for example, may be performed by etching using etching equipment. For this etching, for example, dry etching may be used.

Further, the trench 11 is formed so that the bottom portion reaches the first p⁺-type base 3. Therefore, the trench 11 penetrates the n⁺-type impurity layer 8 of the p-type silicon carbide layer 7 and the n-type silicon carbide layer 4, and the bottom portion reaches the first p⁺-type base 3. Further, after the trench 11 is formed, trench annealing to heat treat the inside of the trench 11 may be performed. After the trench 11 is formed, the deposited film 10 is removed.

Figure 15:
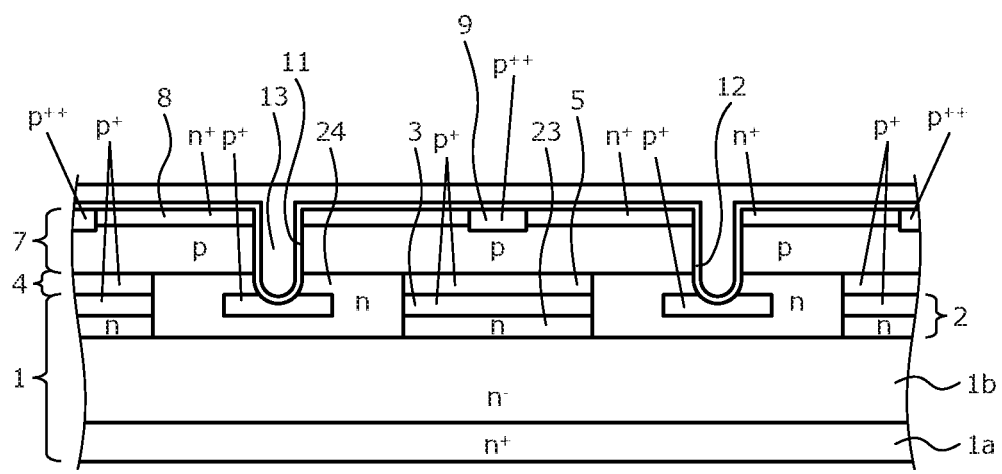

Next, as depicted in FIG. 15, at the bottom and sidewalls of the trench 11, an oxide film is deposited, forming the gate insulating film 12. Thus, the gate insulating film 12 is formed along the bottom and sidewalls of the trench 11. Formation of the gate insulating film 12 by depositing the oxide film, for example, may be performed by a LP-CVD method. On the entire surface of the second p⁺-type base region 17, a poly-silicon (poly-Si) is deposited, forming the gate electrode 13. Formation of the gate electrode 13, for example, may be performed by a LP-CVD method.

Further, the gate insulating film 12 may be formed by a thermal oxidation method. However, in the silicon carbide substrate 1, planar orientations of the bottom, side, and corners of the trench 11 all differ and consequently, the corresponding film thicknesses of the gate insulating film 12 differ. Therefore, for example, the gate insulating film 12 may be formed by a LP-CVD method. Further, the gate electrode 13 may be a phosphorous (P)-doped poly-silicon or a boron (B)-doped poly-silicon. The gate electrode 13 may be formed by introducing an impurity such as phosphoryl chloride (POCl₃) at a high concentration or by ion implantation after a non-doped poly-silicon is deposited.

Figure 16:
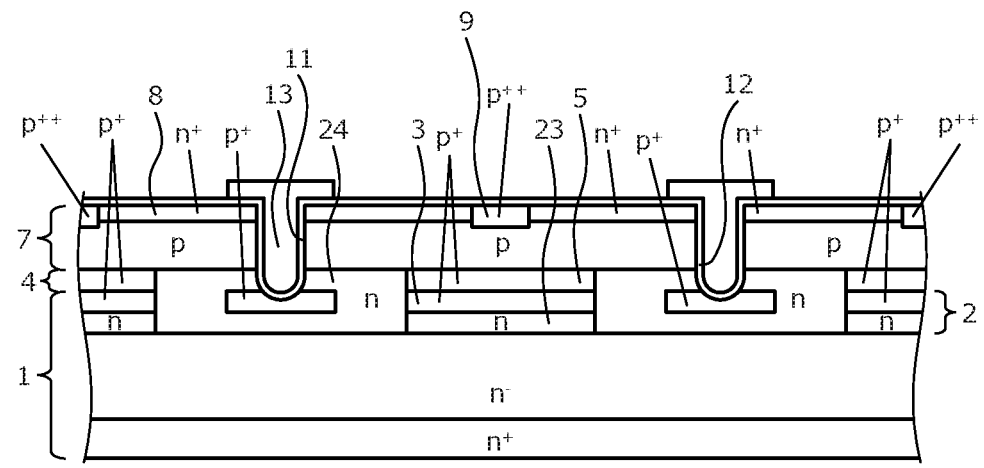

Next, as depicted in FIG. 16, the gate electrode 13 is processed into a desired shape. The processing of the gate electrode 13, for example, may be performed by a photo etching method.

Figure 17:
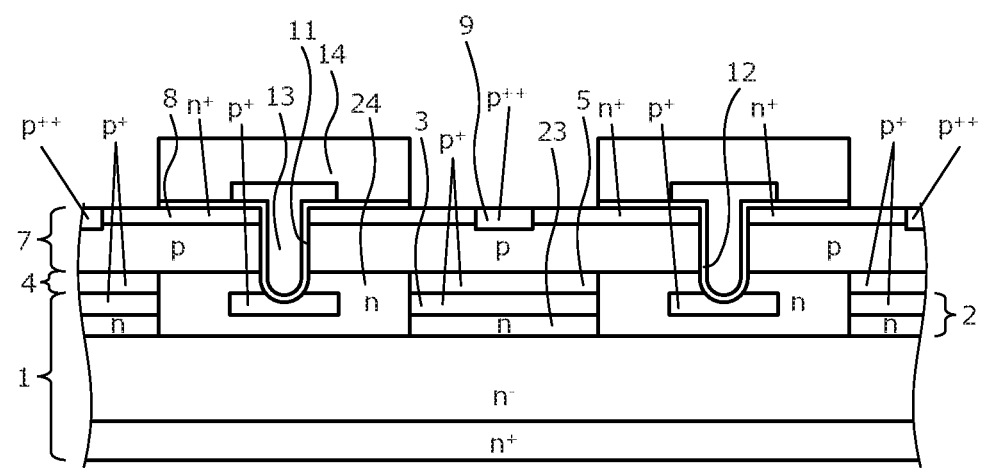

Next, as depicted in FIG. 17, an insulating film is formed on the entire surface of the p-type silicon carbide layer 7 and the deposited insulating film is processed into a desired shape, forming the interlayer insulating film 14 for electrically insulating the gate electrode 13 and the metal wiring 15. Formation of the interlayer insulating film 14 by processing the insulating film, for example, may be performed by a photo etching method.

The state depicted in FIG. 18 will be described. After the state depicted in FIG. 17, on the entire surface of the p-type silicon carbide layer 7 on which the interlayer insulating film 14 is formed, a barrier metal 41 is formed. For example, titanium (Ti) or titanium nitride (TiN) may be used for the barrier metal 41. Formation of the barrier metal 41, for example, may be performed by sputtering. Next, the barrier metal 41 is selectively removed and where the barrier metal 41 is removed, the source electrode 42 is formed. Selective removal of the barrier metal 41, for example, may be performed by etching. For example, nickel (Ni), titanium, or titanium nitride may be used for the source electrode 42. Formation of the source electrode 42, for example, may be performed by sputtering.

Next, on the entire surface of the p-type silicon carbide layer 7 on which the barrier metal 41 and the source electrode 42 are formed, a barrier metal 43 is formed. For example, titanium or titanium nitride may be used for the barrier metal 43. Formation of the barrier metal 43, for example, may be performed by sputtering. Next, on the entire surface of the p-type silicon carbide layer 7 on which the barrier metal 43 is formed, the metal wiring 15 is formed. For example, aluminum, aluminum-silicon (Al—Si), aluminum-copper (Al—Cu), tungsten (W), or copper (Cu) may be used for the metal wiring 15.

Figure 18:
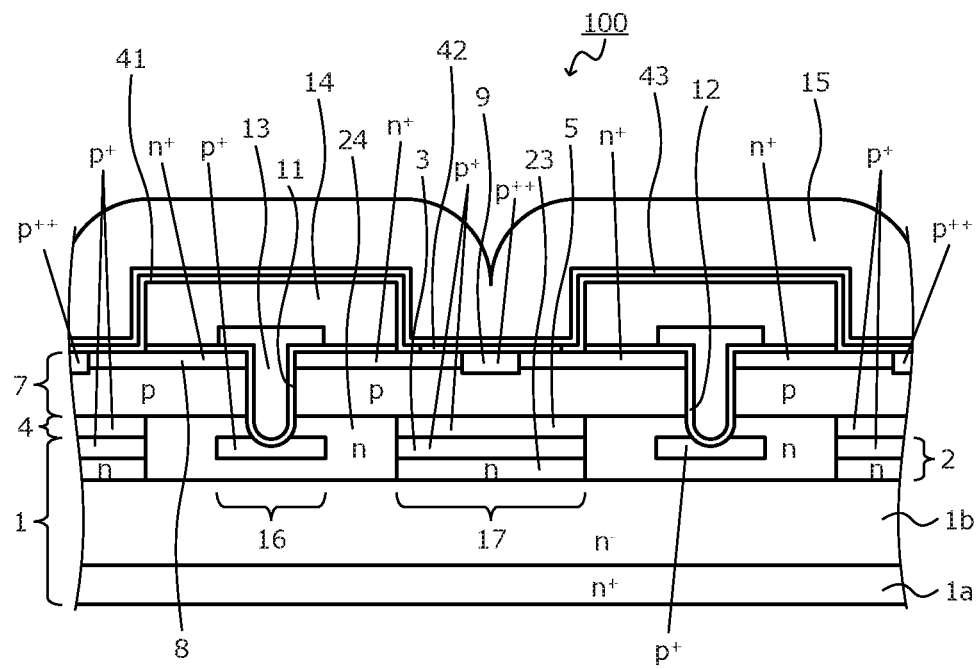
Figure 19:
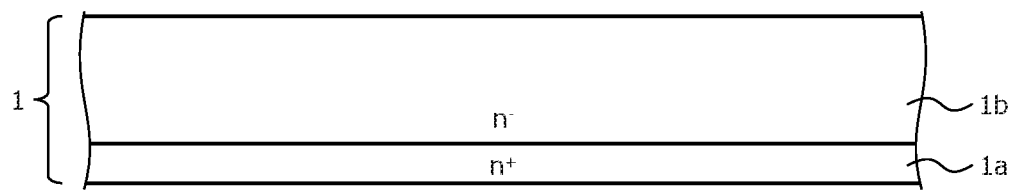
FIGS. 19, 20, 21, 22, 23, 24, 25, 26, 27, 28, 29, 30, 31, 32 and 33 are cross-sectional views of a silicon carbide semiconductor device during manufacture by a conventional method of manufacturing.
Figure 20:
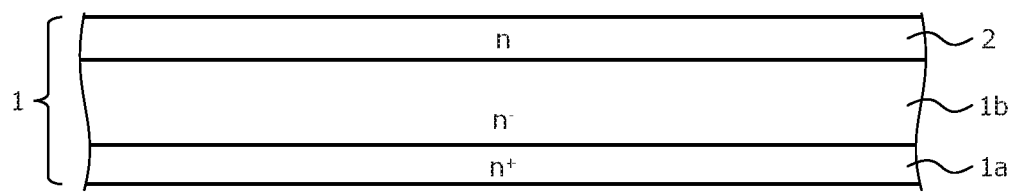
Figure 21:
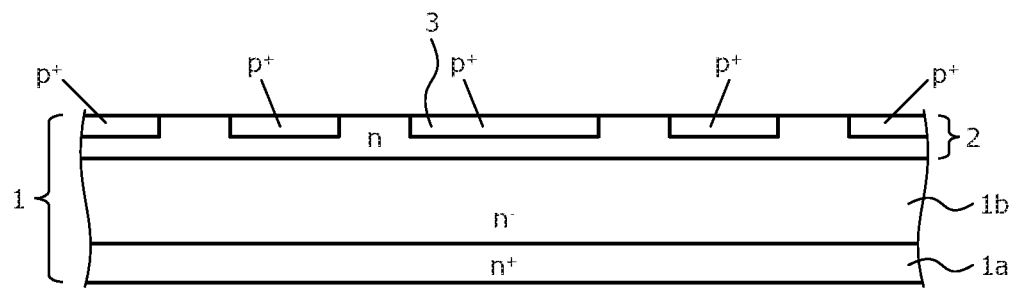
Figure 22:
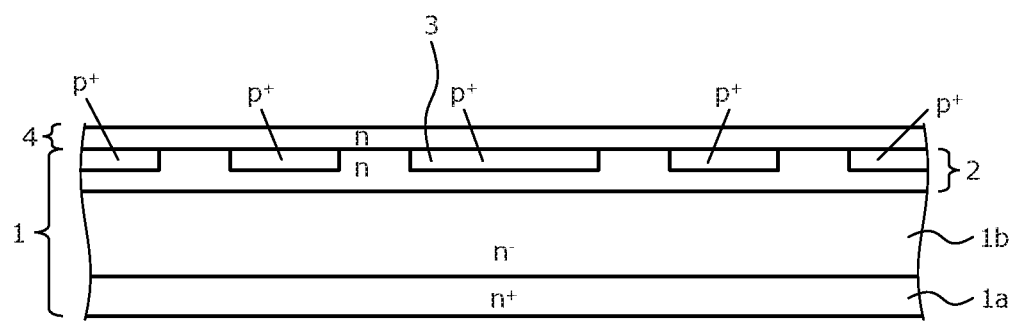
Figure 23:
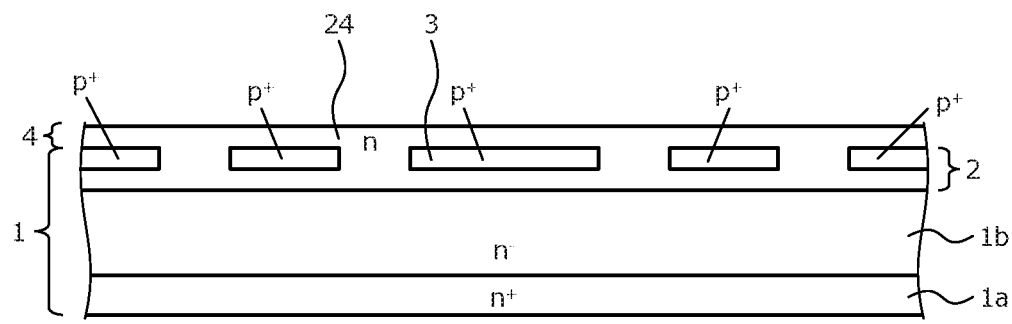
Figure 24:
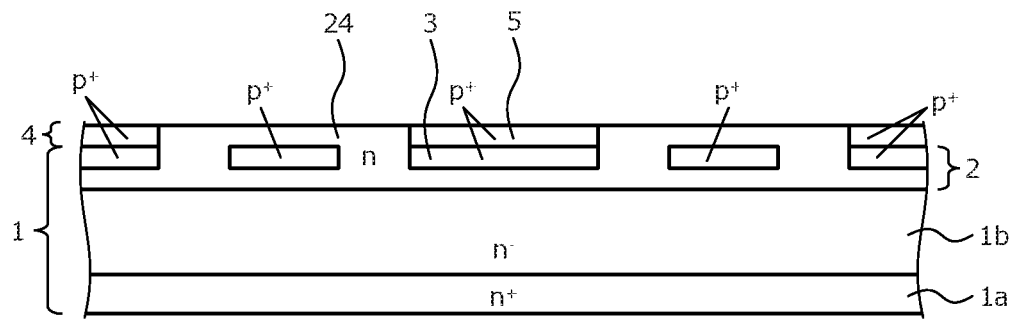
Figure 25:
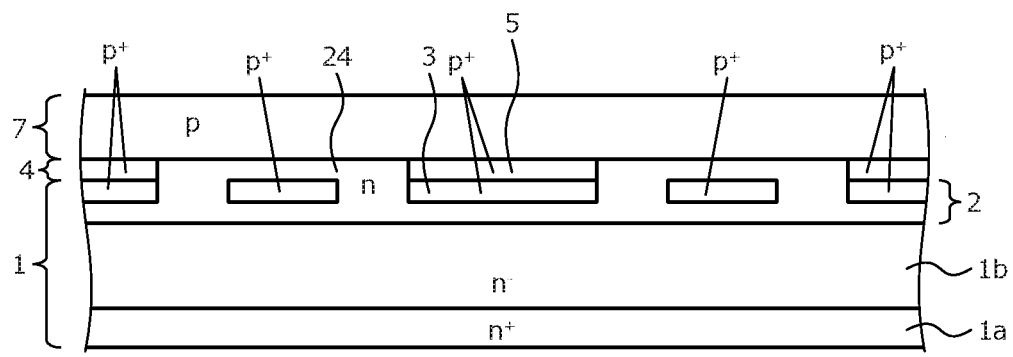
Figure 26:
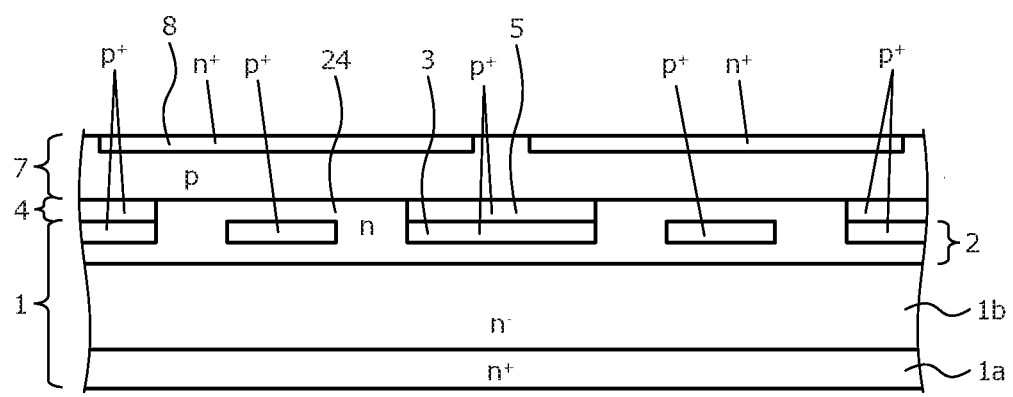
Figure 27:
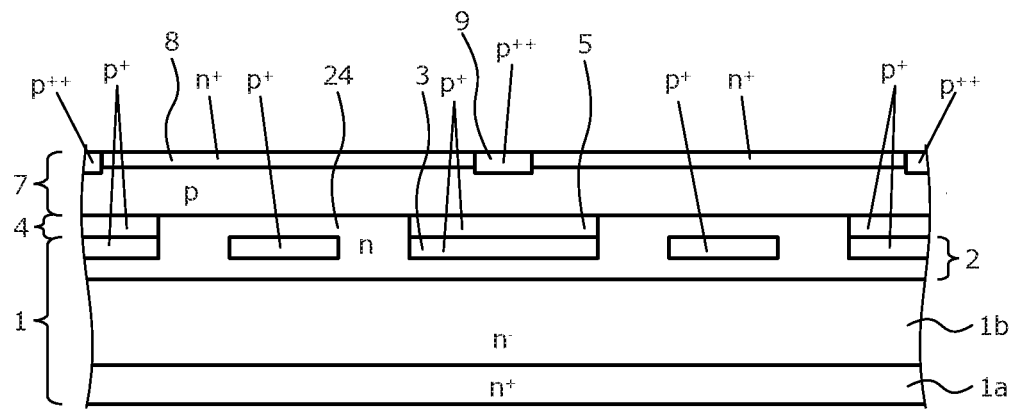
Figure 28:
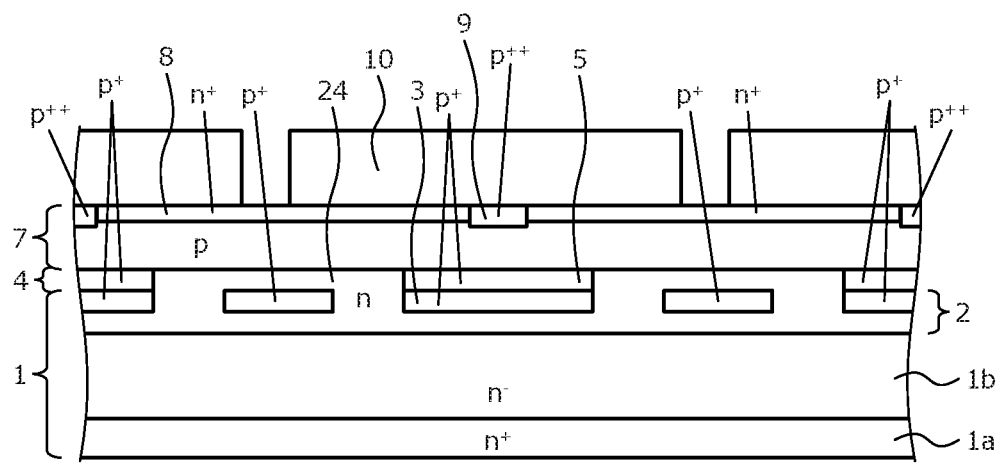
Figure 29:
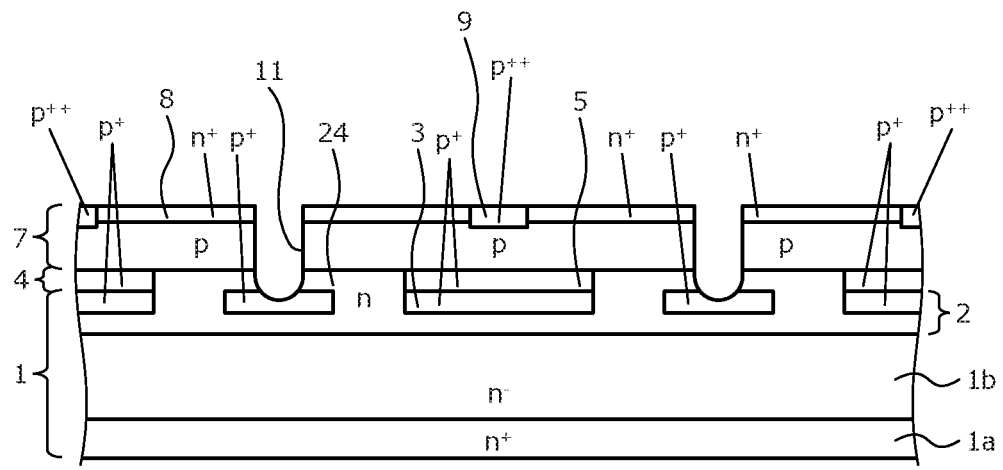
Figure 30:
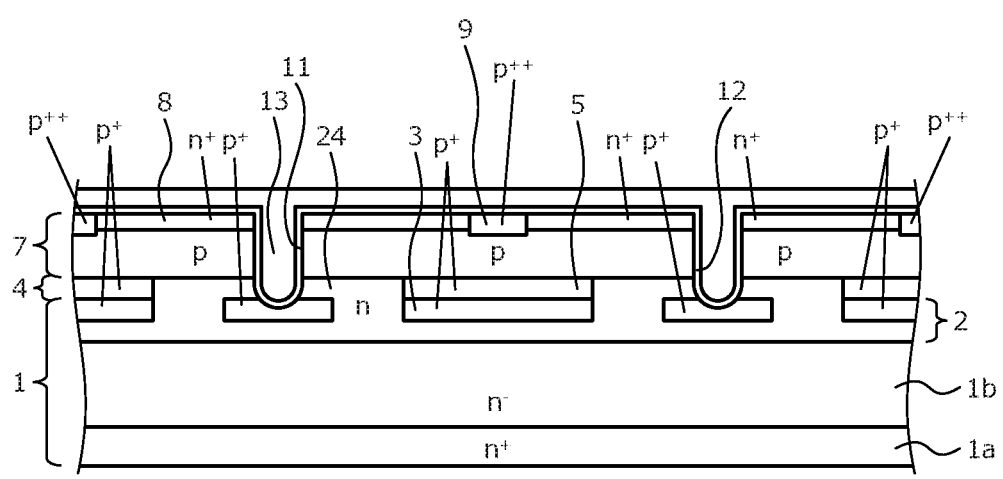
Figure 31:
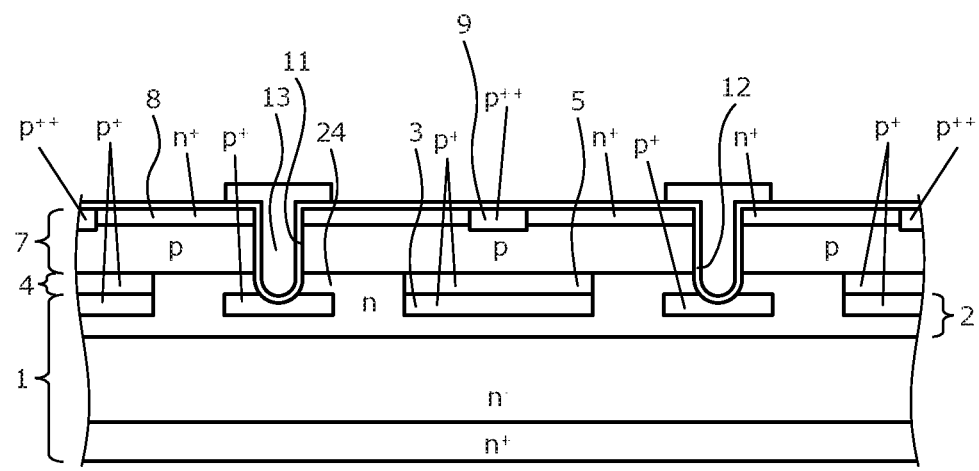
Figure 32:
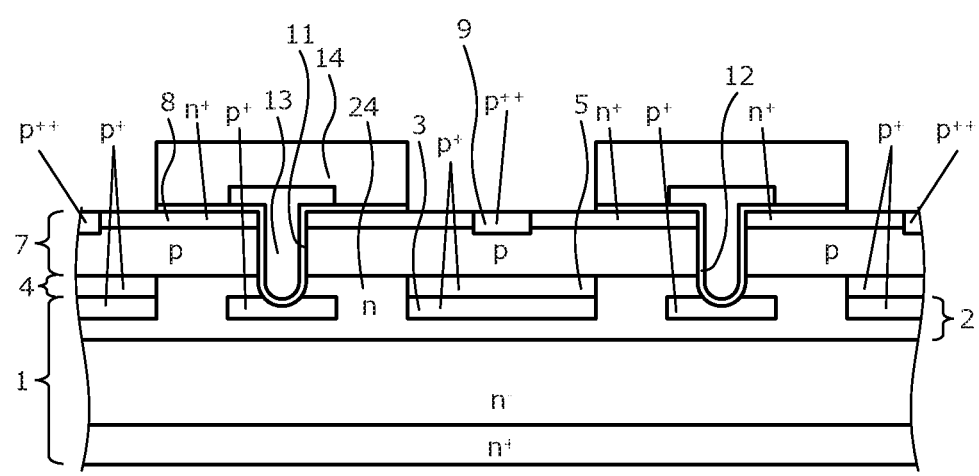
Figure 33:
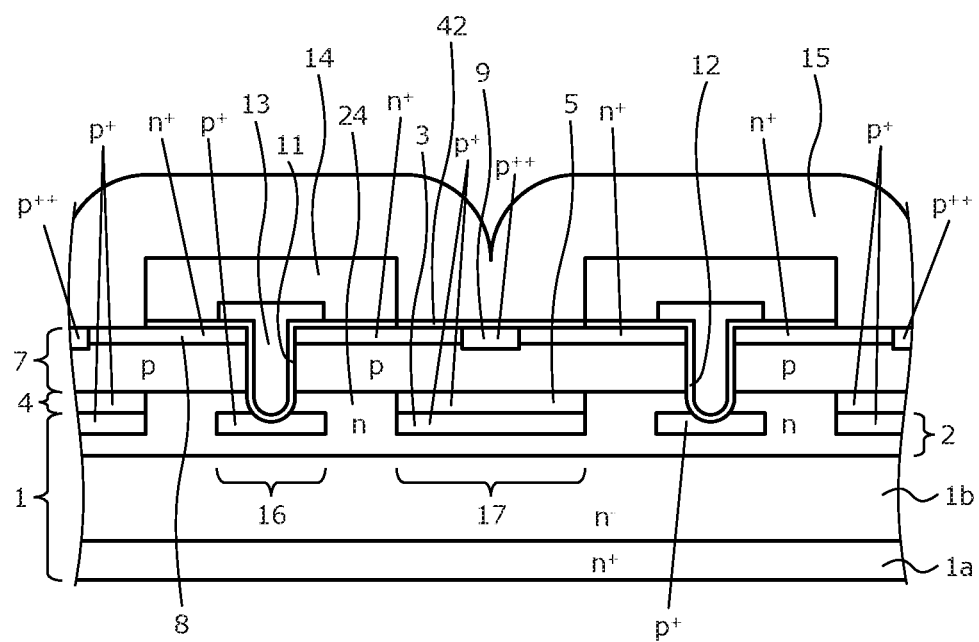

After the state depicted in FIG. 18, on an opposite main surface (rear surface) of the silicon carbide substrate 1, on the opposite side from the n-type silicon carbide layer 4 side of the silicon carbide substrate 1, the rear electrode 25 is formed. The rear electrode 25, for example, may be formed by a nickel film. Next, heat treatment is performed, forming an ohmic contact between the silicon carbide substrate 1 and the rear electrode 25. The heat treatment, for example, may be heat treatment at 970 degrees C. As a result, the silicon carbide semiconductor device 100 (trench-type MOSFET) depicted in FIG. 1 is completed.

As described above, the silicon carbide semiconductor device 100 according to the embodiment enables the n-type impurity concentration directly beneath the first $p^+$-type base region 16 of the bottom portion of the trench 11 to be set to be lower than the n-type impurity concentration directly beneath the second $p^+$-type base region 17. As a result, the breakdown voltage of the first $p^+$-type base region 16 may be set to be higher than the breakdown voltage of the second $p^+$-type base region 17. Therefore, avalanche breakdown may be caused to occur selectively in the second $p^+$-type base region 17, enabling the occurrence of avalanche breakdown at the bottom portion of the trench 11 to be suppressed.

For example, in the silicon carbide semiconductor device 100 that uses silicon carbide, the ratio of the area of the active region (region in which a cell is arranged) is large compared to the area of the edge termination region (region in which an edge termination structure is arranged in a region surrounding a periphery of the active region). The silicon carbide semiconductor device 100 according to the embodiment enables the breakdown voltage to be borne equally via the active region having a large area ratio.

The present invention may be variously modified and in the embodiment above, for example, the dimensions, impurity concentrations, etc. may be set according to required specifications. Further, in the embodiment, although the first conductivity type is assumed to be an n-type and the second conductivity type is assumed to be a p-type, the present invention is similarly implemented when the first conductivity type is a p-type and the second conductivity type is an n-type.

Further, in the embodiment above, layers and regions formed by ion implantation may be formed by an epitaxial method or the like. Furthermore, in the described embodiment, layers and regions formed by an epitaxial method may be formed by ion implantation or the like.

Further, in the described embodiment, although a configuration has been described in which the first $p^+$-type base 3 is formed within a same ranged as the second n-type impurity layer 23 by self-alignment, configuration is not limited hereto. For example, provided effects of the present invention are obtained, the second n-type impurity layer 23 may be formed by a narrower range than that of the first $p^+$-type base 3 or may be formed by a wider range than that of the first $p^+$-type base 3.

Further, in the described embodiment, although only two trench MOS structures (unit cells) are depicted, more trench MOS structures may be arranged in parallel. Furthermore, the silicon carbide semiconductor device 100 may be constituted by a single trench MOS structure.

In the described embodiment, although a case has been described in which the silicon carbide semiconductor device 100 is a trench-type VDMOSFET, the silicon carbide semiconductor device 100 is not limited to a VDMOSFET. In other words, the silicon carbide semiconductor device 100 may be any one of a variety of semiconductor devices having a trench structure on a semiconductor substrate.

A MOS-type semiconductor device such as an insulated gate bipolar transistor (IGBT) is an example of such a semiconductor device. For example, an IGBT may be configured by replacing the silicon carbide substrate 1 of an n-type (n-type drain region) in the silicon carbide semiconductor device 100 depicted in FIG. 1 with a silicon carbide substrate of a p-type (p-type collector region). In this case, the source above becomes the emitter of the IGBT.

Nonetheless, in a conventional silicon carbide semiconductor device, the breakdown voltage for the drain voltage at the first $p^+$-type base region 16 of the bottom portion of the trench 11 and the breakdown voltage for the drain voltage at the second $p^+$-type base region 17 below the $p^{++}$-type impurity layer 9 are substantially the same. Therefore, the breakdown voltage of the first $p^+$-type base region 16 of the bottom portion of the trench 11 may become less than the breakdown voltage of the second $p^+$-type base region 17 below the $p^{++}$-type impurity layer 9 and in this case, the breakdown voltage of the bottom portion of the trench 11 becomes the rate limiting factor for the overall breakdown voltage of the element.

Therefore, avalanche breakdown occurs at the bottom portion of the trench 11 and consequently, carriers are injected to the gate insulating film 12 at the bottom portion of the trench 11; and the injected carriers are captured by a carrier trap in the gate insulating film 12 and modulate the local electric field in the gate insulating film 12. Further, consequent to the change in the local electric field, the local electric field may become stronger whereby further carrier injection may occur, creating an unfavorable cycle whereby the gate insulating film 12 may be destroyed.

The silicon carbide semiconductor device and the method of manufacturing a silicon carbide semiconductor device according to the present invention achieve an effect in that the occurrence of avalanche breakdown at the bottom portion of the trench may be suppressed.

As described above, the semiconductor device and the method of manufacturing a semiconductor device according to the present invention are useful for semiconductor devices having a trench structure and are particularly suitable for semiconductor devices that use silicon carbide.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide substrate of a first conductivity type, having a front surface and a rear surface;
   a first silicon carbide layer of the first conductivity type, formed on the front surface of the silicon carbide substrate;
   a first impurity layer and a second impurity layer, both of a second conductivity type, selectively formed in the first silicon carbide layer at a first surface thereof;
   a second silicon carbide layer of the first conductivity type, formed on the surface of the first silicon carbide layer, the second silicon carbide layer having a first surface and a second surface opposite to each other, the second surface thereof facing the first silicon carbide layer;
   a third impurity layer of the second conductivity type, selectively formed in the second silicon carbide layer and on the second impurity layer;
   a third silicon carbide layer of the second conductivity type, formed on the first surface of the second silicon carbide layer;
   a fourth impurity layer of the first conductivity type, selectively formed in the third silicon carbide layer at a first surface thereof;
   a trench that penetrates the fourth impurity layer, the third silicon carbide layer and the second silicon carbide layer, the trench having a bottom that reaches the first impurity layer, and sidewalls;
   a gate insulating film formed in the trench and covering the bottom and the sidewalls of the trench;
   a gate electrode formed in the trench on the gate insulating film;
   an interlayer insulating film covering the gate electrode;
   a first electrode in contact with the fourth impurity layer and the third silicon carbide layer; and
   a second electrode formed on the rear surface of the silicon carbide substrate, wherein
   the first silicon carbide layer has a first region and a second region that are adjacent respectively to the first and second impurity layers on a side facing the silicon carbide substrate, an impurity concentration of the first conductivity type at the first region being lower than that at the second region.

2. The silicon carbide semiconductor device according to claim 1, further comprising a fifth impurity layer of the first conductivity type that is selectively formed in the second region of the first silicon carbide layer.

3. The silicon carbide semiconductor device according to claim 2, wherein the second impurity layer has a width equal to a width of the fifth impurity layer.

4. The silicon carbide semiconductor device according to claim 1, wherein the first and second impurity layers are respectively formed at a first position and a second position, the first position being closer to the rear surface of the silicon carbide substrate than the second position along a direction orthogonal to the main surface of the silicon carbide substrate.

5. A method of manufacturing a silicon carbide semiconductor device, the method comprising:
   providing a silicon carbide substrate of a first conductivity type, the silicon carbide substrate having a front surface and a rear surface;
   forming a first silicon carbide layer of the first conductivity type on the front surface of the silicon carbide substrate;
   selectively forming a first impurity layer and a second impurity layer, both of a second conductivity type, in the first silicon carbide layer on a first surface thereof;
   forming a second silicon carbide layer of the first conductivity type on the first surface of the first silicon carbide layer, the second silicon carbide layer having a first surface and a second surface opposite to each other, the second surface thereof facing the first silicon carbide layer;
   selectively forming a third impurity layer of the second conductivity type in the second silicon carbide layer and on the second impurity layer;
   forming a third silicon carbide layer of the second conductivity type on the first surface of the second silicon carbide layer;
   selectively forming a fourth impurity layer of the first conductivity type in the third silicon carbide layer at a first surface thereof;
   forming a trench that penetrates the fourth impurity layer, the third silicon carbide layer and the second silicon carbide layer, the trench having a bottom that reaches the first impurity layer, and sidewalls;
   forming a gate insulating film in the trench to cover the bottom and the sidewalls of the trench;
   forming a gate electrode in the trench on the gate insulating film;
   forming an interlayer insulating film to cover the gate electrode;
   forming a first electrode in contact with the fourth impurity layer and the third silicon carbide layer; and
   forming a second electrode on the rear surface of the silicon carbide substrate, wherein
   the first silicon carbide layer has a first region and a second region that are adjacent respectively to the first and second impurity layers on a side facing the silicon carbide substrate, an impurity concentration of the first conductivity type at the first region being lower than that at the second region.

6. The method according to claim 5, comprising
   forming a fifth impurity layer of the first conductivity type in the second region of the first silicon carbide layer.

7. The method according to claim 6, wherein forming the second impurity layer includes
   introducing an impurity of the second conductivity type into a region of the first silicon carbide layer that is adjacent to a side of the fifth impurity layer facing the silicon carbide substrate, so as to form the second impurity layer that is self-aligned with the fifth impurity layer.

8. The method according to claim 6, wherein selectively forming the first impurity layer and the second impurity layer includes:
   forming a mask in a third region of the first surface of the first silicon carbide layer, which is exclusive of a fourth region in which the first impurity layer and the second impurity layer are to be formed,
   forming a photoresist in the fourth region of the first silicon carbide layer and at where the first impurity layer is to be formed,
   introducing an impurity of the first conductivity type to the first surface of the first silicon carbide layer so as to form the fifth impurity layer,
   removing the photoresist,
   introducing an impurity of the second conductivity type to the first surface of the first silicon carbide layer so as to form the first impurity layer and the second impurity layer, and
   removing the mask.

* * * * *